(12) United States Patent
Shu

(10) Patent No.: US 9,716,489 B1
(45) Date of Patent: Jul. 25, 2017

(54) METHOD AND APPARATUS FOR IMPROVED INPUT DATA SLICER

(71) Applicant: CHRONTEL INTERNATIONAL LTD., Hamilton (BM)

(72) Inventor: Tzi-Hsiung Shu, San Jose, CA (US)

(73) Assignee: CHRONTEL INTERNATIONAL LTD. (BM)

( * ) Notice: Subject to any disclaimer, the term of this patent is extended or adjusted under 35 U.S.C. 154(b) by 0 days.

(21) Appl. No.: 14/819,868

(22) Filed: Aug. 6, 2015

Related U.S. Application Data

(60) Provisional application No. 62/187,664, filed on Jul. 1, 2015.

(51) Int. Cl.
| | |
|---|---|
| *H03K 3/01* | (2006.01) |
| *H03K 3/013* | (2006.01) |
| *H03K 3/037* | (2006.01) |
| *H03K 5/24* | (2006.01) |

(52) U.S. Cl.
CPC ........... *H03K 3/013* (2013.01); *H03K 3/0377* (2013.01); *H03K 5/24* (2013.01)

(58) Field of Classification Search
CPC ........ H03K 3/013; H03K 3/3077; H03K 5/24; G06F 19/3437; G06F 17/5009; G06F 19/3431; G06F 19/12; G06F 19/26; G06F 21/50; G06F 21/88
USPC .......................... 327/200, 202, 203, 205, 206
See application file for complete search history.

(56) References Cited

U.S. PATENT DOCUMENTS

| | | | | |
|---|---|---|---|---|
| 5,768,285 | A | * 6/1998 | Griep ............... | G11B 20/10009 375/262 |
| 2011/0041047 | A1 | * 2/2011 | Tran ........................ | H04L 1/242 714/819 |

* cited by examiner

*Primary Examiner* — John Poos
(74) *Attorney, Agent, or Firm* — Pillsbury Winthrop Shaw Pittman LLP

(57) ABSTRACT

An improved slicer for a data receiver is described. In particular, an improved slicer architecture with improved noise immunity and improved tolerance to signal level shift of an input signal to the data receiver is disclosed. The improvement is achieved through using multiple comparators to account for a wider range of the noise and input signal level shift. Other methods and apparatuses are described therein, including a two-comparator and a four comparator embodiments.

18 Claims, 4 Drawing Sheets

METHOD AND APPARATUS FOR IMPROVED INPUT DATA SLICER

RELATED APPLICATIONS

This application claims priority from U.S. provisional application Ser. No. 62/187,664 filed Jul. 1, 2015. The disclosure of this application is incorporated herein by reference.

FIELD OF THE RELATED ART

Described are methods and apparatuses for an improved data slicer, and, particularly an architecture that allows for improved noise immunity and tolerance to input signal level shift.

BACKGROUND

A slicer is usually used in a digital data receiver to determine the logical value of an input data signal. For a slicer to make a correct decision, an input signal representing a logic 1 must be sufficiently apart from an input signal representing a logic 0. As such, the input data signal is required to meet a certain minimum input eye mask requirement so the slicer can determine whether an input signal is representing a logic 1 or a logic 0. Usually, the signal amplitude difference (or eye height) is used as such a minimum eye mask requirement and is designated as $V_{EH}$. At the same time, some noise immunity is preferred in that when the input signal level is below a certain limit, it is considered noise and the slicer is not required to respond to it. There are several known schemes to achieve such noise immunity, one of which is to design a comparator with built-in hysteresis.

Refer to the example shown in FIG. 1, given a minimum eye opening requirement, one can design a slicer for maximum noise immunity for any input signal that meets the minimum eye opening requirement. Such a slicer has a rising edge threshold $V_{thr}$ close to the top the minimum eye mask and a falling edge threshold $V_{thf}$ close to the bottom of the minimum eye mask respectively. The noise immunity of the slicer is thus $V_{hyst}=V_{thr}-V_{thf}$. As depicted in FIG. 1, the slicer can have a maximum possible noise immunity of $V_{hyst,max}=V_{EH}$.

FIG. 2 illustrates how a conventional slicer makes a decision as to whether the input signal is a logic 1 or logic 0 in an ideal case when there is no noise. The top waveform depicts the input data signal and the bottom the corresponding output of the slicer having rising edge threshold $V_{thr}$ and falling edge threshold $V_{thf}$. As depicted, point 201 represents a point at the rising curve of the input signal if sampled the sampled value is equal to $V_{thr}$ of the slicer. For any point on the rising curve of the input signal, if the sampled value is lower than that of point 201, the slicer outputs a logic 0. The slicer outputs a logic 1 only when the sampled value of the input signal equals to or is greater than $V_{thr}$. Point 202 represents a point on the falling curve of the input signal if sampled the sampled value is equal to $V_{thf}$ of the slicer. As shown, the slicer outputs a logic 1 as long as the sampled input is greater than $V_{thf}$. Only when the sampled input falls below the $V_{thf}$ does the slicer outputs a logic 0.

However, in complex systems, the corresponding input signals to the slicer not only tend to degrade as external noise increases but also shift in signal level due to, for example, unequal ground reference between the transmitter and receiver, Consequently, the resulting signal eye opening at the receiver shrinks, as shown in FIG. 3. If the signal is shifted up/down by $V_{os}$, the available eye opening for a conventional slicer hysteresis is reduced to $V_{hyst,conv}=V_{EH}-2*V_{os}$, Therefore the noise immunity is reduced as a result of the shifting of $V_{os}$. Even worse, when $V_{os}>V_{EH}/2$, the conventional slicer scheme ceases to function correctly since no decision level can be set such that the comparator can determine the input data correctly.

Accordingly there remains a need in the art for a solution that addresses the problems above among others.

SUMMARY

Described generally is an input data slicer, and more particularly to apparatus and method of an improved input data slicer that allows for improved noise immunity and tolerance to input signal level shift. According to certain aspects, the apparatus includes a number of comparators and a selection circuit. Each of the number of comparators is configured to have a built-in hysteresis and reference levels and receive an input signal. Each comparator then generates an output based on the input signal and the built-in hysteresis and reference levels. The selection circuit is configured to receive the output of the comparators and generate an output of the slicer corresponding to the input signal.

BRIEF DESCRIPTION OF THE DRAWINGS

These and other aspects and features will become apparent to those ordinarily skilled in the art upon review of the following description of specific embodiments in conjunction with the accompanying figures, wherein.

DETAILED DESCRIPTION OF THE PREFERRED EMBODIMENTS

Figure 1:
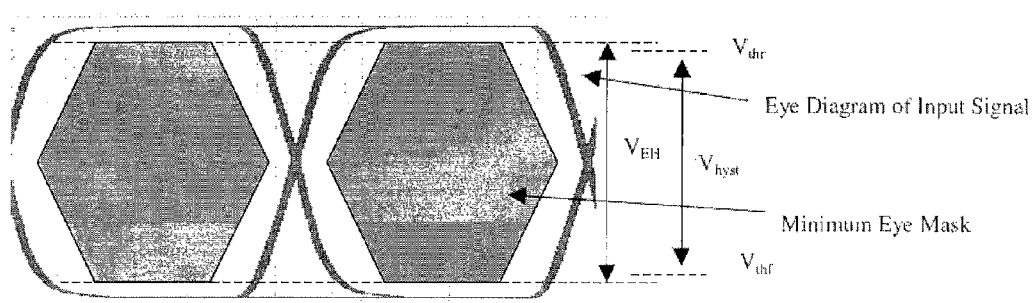
FIG. 1 illustrates an example of input signal meeting the minimum eye mask.
Figure 2:
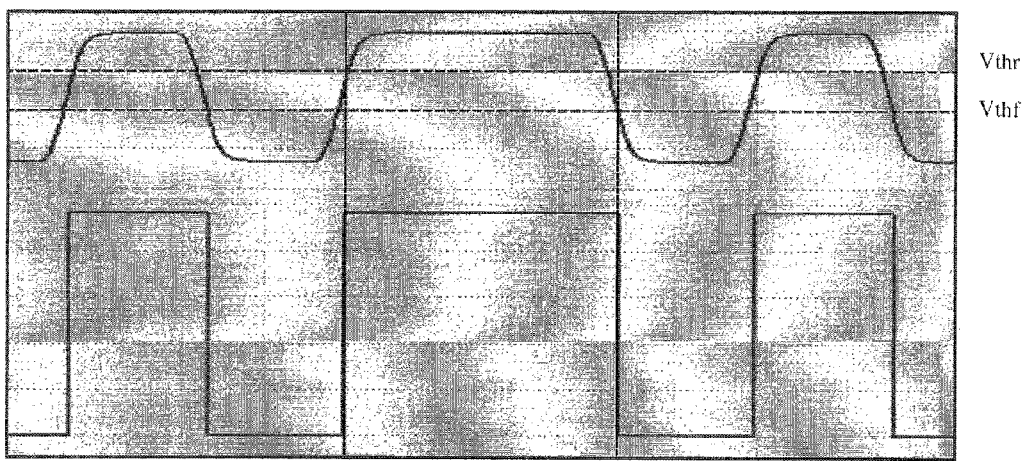
FIG. 2 illustrates how a conventional slicer makes a decision as to whether the input signal is a logic 1 or logic 0 in an ideal case when there is no noise.
Figure 3:
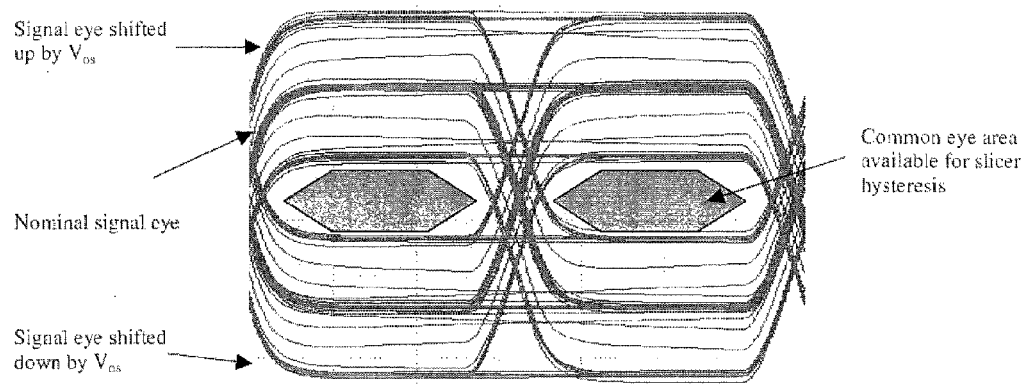
FIG. 3 illustrates the shrinking of detection hysteresis due to a conventional input DC shift.

This will now be described in detail with reference to the drawings, which are provided as illustrative examples so as to enable those skilled in the art. Notably, the figures and examples below are not meant to limit the scope to a single embodiment, but other embodiments are possible by way of interchange of some or all of the described or illustrated elements.

Moreover, where certain elements can be partially or fully implemented using known components, only those portions of such known components that are necessary for an understanding will be described, and detailed descriptions of other portions of such known components will be omitted.

Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants does not intend for any term in the specification or claims to be ascribed an uncommon or special meaning unless explicitly set forth as such. Further, the embodiments encompasses present and future known equivalents to the known components referred to herein by way of illustration.

In the present invention, a slicer that addresses the problems discussed above comprises a number of comparators and a selection circuit. According to some embodiments, each one of the N comparator is designed with a built-in hysteresis. The rising-edge threshold and the falling-edge threshold for the k-th comparator are denoted as $V_{thr,k}$ and $V_{thf,k}$, respectively.

As shown, the comparators have the same hysteresis, i.e., $V_{thr,k} - V_{thf,k} = V_{hyst}$. It should be noted, however, that the sliver can also be adapted to use comparators having different hysteresis. Without loss of generality, the rest of the discussion assumes that the comparators have the same hysteresis unless stated otherwise. It should be apparent to a person of ordinary skill in the art to apply the same principle discussed below to implementations using comparators having different hysteresis.

Without loss of generality, the comparators are labeled sequentially such that $V_{thr,0} < V_{thr,1} < \ldots < V_{thr,k} < \ldots < V_{thr,N-1}$ and $V_{thf,0} < V_{thf,1} < \ldots < V_{thf,k} < \ldots < V_{thf,N-1}$. The threshold level steps between consecutive comparators ($V_{thr,k} - V_{thr,k-1}$ and $V_{thf,k} - V_{thf,k-1}$) in general can be arbitrary. However, without loss of generality, it is assumed that in the following discussion the threshold steps are identical. That is, $V_{thr,k} - V_{thr,k-1} = V_{thf,k} - V_{thf,k-1} = V_{step}$.

Each comparator in the list of the N comparators receives the same input signal ($V_{in}$) and generates its own output result $D_k$. In some implementations, $D_k$=logic 1 if $V_{in} > V_{thr,k}$, $D_k$=logic 0 if $V_{in} < V_{thf,k}$, and $D_k$ does not change its state if $V_{thf,k} < V_{in} < V_{thr,k}$.

According to some embodiments, the selection circuit maintains a pointer P. Based on the value of the pointer P, the selection circuit selects one of the N comparators and uses the output of the selected comparator as the slicer output $D_{out}$. That is, when P=k, $D_{out} = D_k$.

The method to determine the correct value for the pointer P is as follows:

Assuming P=k at the moment, the pointer P is increased by 1 (i.e., P=k+1) if $D_{k+1}$ changes from 0 to 1. The pointer P is decreased by 1 (i.e., P=k-1) if $D_{k-1}$ changes from 1 to 0. In other words, the pointer points to the next comparator up the sorted list of comparators if the input signal increases above the rising edge threshold of the next comparator with a higher rising edge threshold $V_{thr,k+1}$; the pointer points to the next comparator down the sorted list of comparators if the input signal level drops below the falling edge threshold of the next comparator with a lower falling edge threshold $V_{thf,k-1}$. The pointer P operates continuously in response to the changes in the N comparator outputs.

In some other embodiments, the selection circuit does not maintain a pointer but is instead implemented as an integrated circuit that is customized for a given number of comparators. For example, the selection circuit may generate a selection signal for a multiplexer.

Consider that the input signal consists of a normal data pattern with signal swing of $V_{EH}$ between states of logic 0 and logic 1 and a time varying DC shift. It should be clear to those skilled in the art that the overall noise immunity of the present invention is determined by the noise immunity of the comparator selected by the pointer. It should also be clear that the maximum noise immunity of the present invention is such that $V_{EH} = V_{hyst,max} + V_{step}$. Therefore, $V_{hyst,max} = V_{EH} - V_{step}$. Note that the maximum noise immunity can be made to approach $V_{EH}$ by decreasing $V_{step}$. Therefore the effect of DC shift on the data received is removed while maintaining high noise immunity.

Two Comparator Implementation

Figure 4:
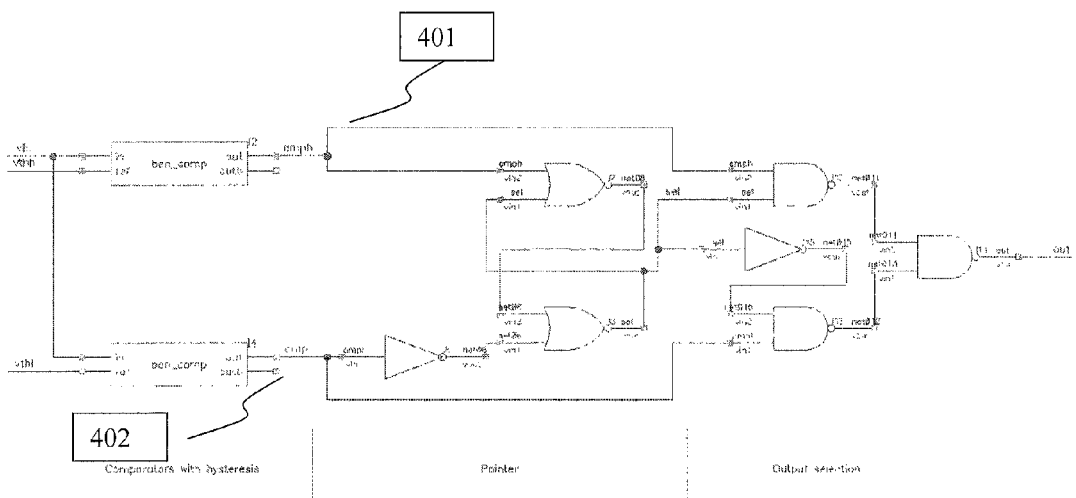
FIG. 4 illustrates a schematic of an embodiment using two comparators.

FIG. 4 shows a schematic of a preferred embodiment using two comparators. Each of the two comparators in the implementation has different detection thresholds. A selection circuit is used to determine what the correct receiver output value should be based on the results of the two comparators.

Figure 5:
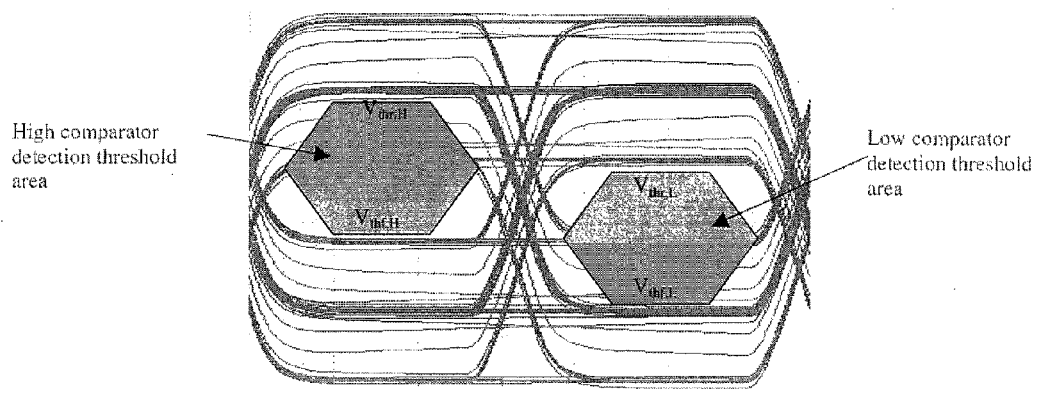
FIG. 5 illustrates the available threshold area of a two comparator embodiment.

The high comparator (401) has threshold voltages set to cover the case when the input is between nominal and shifted up by $V_{os}$. The low comparator (402) has the threshold voltages set to cover the case when the input is between nominal and shifted down by $V_{os}$, as shown in FIG. 5, Without loss of generality, it is assumed that $V_{step} = V_{os}$ in this implementation.

The principle of the operation is as follows. When the input signal swings above the high comparator rising edge threshold, $V_{thr,H}$, the selection circuit is tripped to output the result of the high comparator. For example, if the high comparator outputs a logic 1, the selection circuit also outputs a logic 1. Then the input signal swings low. If the input signal stops above the $V_{thf,H}$, it is considered noise because it does not meet the minimum eye mask requirement. The output of the high comparator remains logic 1. If the input signal swings lower than $V_{thf,H}$, the high comparator output changes to logic 0 and so is the slicer output. If the input signal continues to swing low below the $V_{thf,L}$, the low comparator outputs a logic 0. The selection circuit outputs the result from the low comparator. As the input signal swings up again the decision output is the same as the low comparator until the input signal goes above $V_{thr,H}$.

The maximum noise immunity is $V_{hyst,max} = V_{EH} - V_{OS}$, which is improved compared to the conventional design as discussed in the background section above.

It is noted that in the above description, references are made with respect to two threshold levels ($V_{thr,H}$ and $V_{thf,L}$) for ease of understanding and clarity. In FIG. 4, the rising and falling thresholds are not explicitly shown on schematic to reduce clutter. Instead, each comparator (401 or 402) takes in one reference level and generates the two thresholds in the comparators internally (not shown). In this implementation each comparator takes in a reference level and sets up its hysteresis thresholds around the given reference level. It is however well known to an ordinary person of skill in the art how to set up the rising and falling edge thresholds for hysteresis.

In some embodiments, the pointer is implemented as an R—S flip-flop with a single output (sel). When sel=1, the pointer points to the high comparator; when sel=0, the pointer points to the low comparator.

In some embodiments, the output selection circuit is implemented as a 2-to-1 multiplexer, where when sel=1, the comparator output cmph is passed on to the slicer output and when sel=0, the comparator output cmpl is passed on to the slicer output. This multiplexer by itself is also known prior art.

Figure 6:
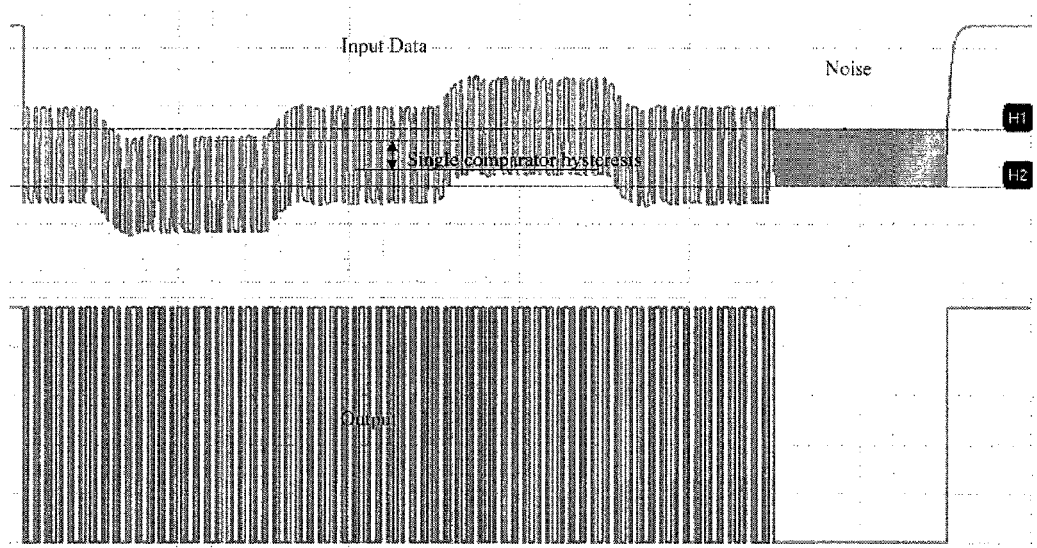
FIG. 6 illustrates a simulation result showing input data and noise (top) and output (bottom) according to a two comparator embodiment.

A sample simulation result for a two-comparator embodiment is shown in FIG. 6. It shows the effectiveness in response to input signal shift and noise. Note that the amplitude of the noise at later part of the signal trace (between H1 and H2) is greater than what hysteresis a single comparator can implement to detect the input signal correctly. The receiver distinguishes between data and noise without any error.

Four Comparator Implementation

Figure 7:
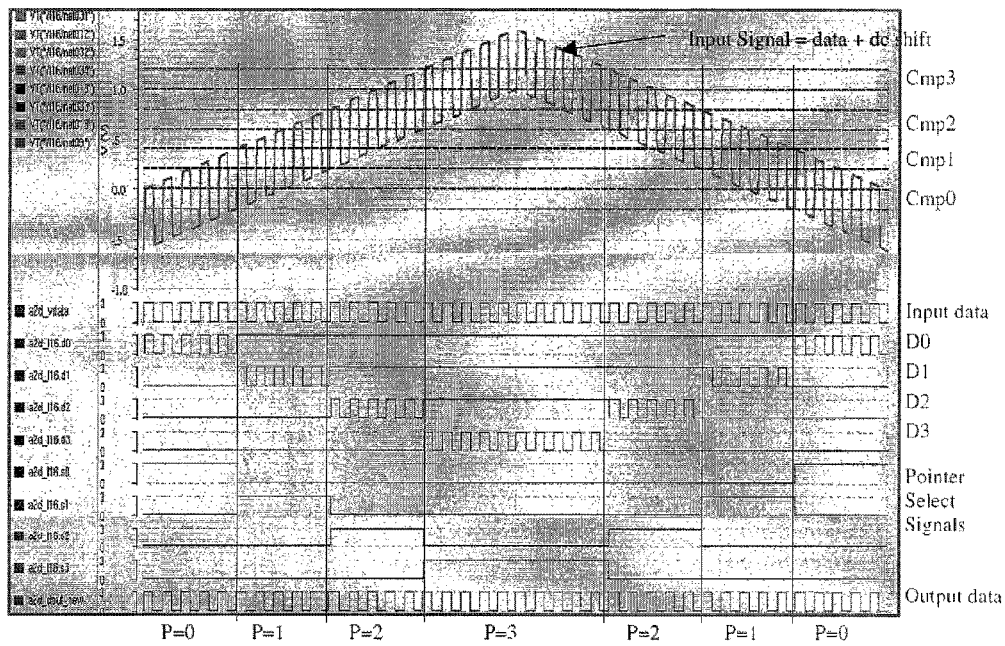
FIG. 7 illustrates a simulation result of a four comparator embodiment.

FIG. 7 is a simulation result illustrating an embodiment using four comparators to correctly determine the input data with significant dc shift. As shown, the input signal consists of the desired data and a triangular ramp that shifts the signal level of the input. In this simulation, the data has a signal swing of 0V to 0.5V while the triangular ramp is from −0.5V to 1V. The input signal, as a result, can be as low as −0.5V and as high as 1.5V. Note that each comparator has a valid input range in which it can detect the data correctly and beyond which its output is invalid. The present invention combines and selects the outputs of the comparators into the resulting output, which is valid all the time. Note also that with such an input signal, the conventional single comparator design (prior art) cannot function correctly.

Figure 8:
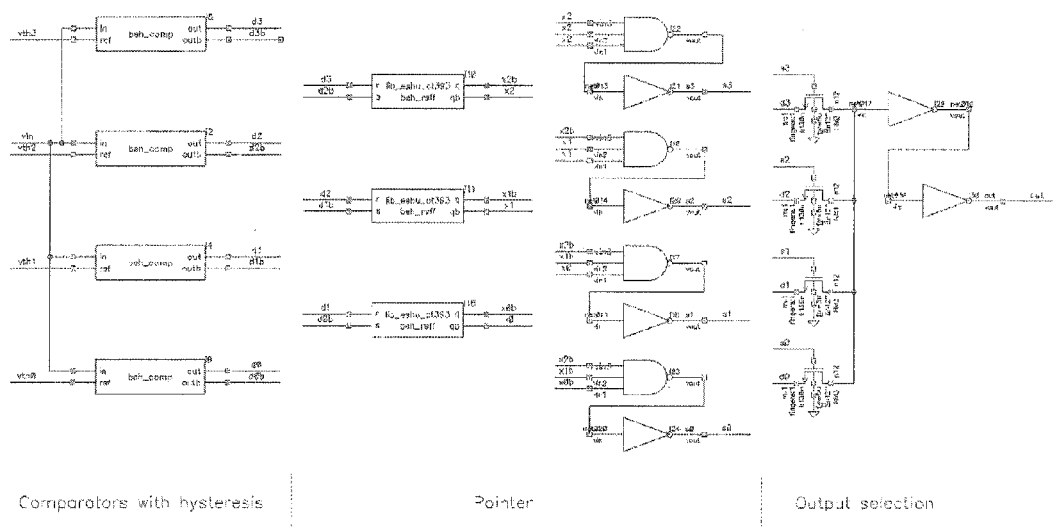
FIG. 8 illustrates a schematic of a preferred embodiment using four comparators.

FIG. 8 shows a schematic of a preferred embodiment using four comparators. Similar to FIG. 4, the rising and falling thresholds are not explicitly shown in FIG. 8 to reduce clutter. Instead, each comparator takes in one reference level and generates the two thresholds within the comparators (not shown). It is however well known to an ordinary person of skill in the art how to generate two thresholds from one reference signal within a comparator. In an alternative implementation, one can also have two threshold values as an input to a comparator thus each comparator does not need to generate two thresholds from one reference input.

The extension to cases of more than 4 comparators should be apparent to a person skilled in the art in light of the above description.

In the discussion above, references with respect to signal measurements are made in voltage domain. However, it should be noted that the invention is not limited to signals in voltage domain. In fact, the same principal also applies to other measurements of the signals such as current or light intensity.

Although described with reference to the preferred embodiments thereof, it should be readily apparent to those of ordinary skill in the art that changes and modifications in the form and details may be made without departing from the spirit and scope of the embodiments. It is intended that the appended claims encompass such changes and modifications.

What is claimed:

1. A slicer for a data receiver having improved noise immunity and tolerance to signal level shift of an input signal to the data receiver, comprising:
   a plurality of comparators, wherein each comparator k is configured to have a built-in hysteresis with a rising-edge threshold equal to $V_{thr,k}$ and a falling-edge threshold equal to $V_{thf,k}$ respectively, and receives the input signal ($V_{in}$) and generates its own output $D_k$; and
   a selection circuit configured to maintain a pointer P, wherein the pointer P is used to select one of the plurality of comparators and use the output of the selected comparator as the slicer output $D_{out}$.

2. The slicer of claim 1, wherein the built-in hysteresis of the plurality of comparators are the same.

3. The slicer of claim 1, wherein $D_k=1$ if $V_{in}>V_{thr,k}$, $D_k=0$ if $V_{in}<V_{thf,k}$, and $D_k$ does not change its state if $V_{thf,k}<V_{in}<V_{thr,k}$.

4. The slicer of claim 1, wherein the plurality (N) of comparators are configured such that $V_{thr,0}<V_{thr,1}<\ldots<V_{thr,k}<\ldots<V_{thr,N-1}$ and $V_{thf,0}<V_{thf,1}<\ldots<V_{thf,k}<\ldots<V_{thf,N-1}$.

5. The slicer of claim 2, wherein the threshold level steps between consecutive comparators are identical.

6. The slicer of claim 4, wherein the threshold level steps between consecutive comparators are identical.

7. The slicer of claim 2, wherein the selection circuit is configured to cause the pointer P to:
   point to the next comparator with a higher rising edge threshold in the sorted plurality of comparators if the input signal goes above the rising edge threshold of the next comparator; and
   point to the next comparator with a lower falling edge threshold in the plurality of comparators if the input signal goes below the falling edge threshold of the next comparator.

8. The slicer of claim 5, wherein the selection circuit is configured to cause the pointer P to point to the next comparator up in the sorted plurality of comparators if the input signal goes above the rising edge threshold of the next comparator with a higher rising edge threshold and it points to the next comparator down the plurality of comparators if the input signal goes below the falling edge threshold of the next comparator with a lower falling edge threshold.

9. The slicer of claim 6, wherein the selection circuit is configured to cause a pointer P to:
   point to the next comparator with a higher rising edge threshold in the sorted plurality of comparators if the input signal goes above the rising edge threshold of the next comparator; and
   point to the next comparator with a lower falling edge threshold in the sorted plurality of comparators if the input signal goes below the falling edge threshold of the next comparator.

10. A slicer for a data receiver with improved noise immunity and tolerance to signal level shift of an input signal to the data receiver, comprising:
    a first comparator configured to have a first built-in hysteresis and to receive the input signal, wherein the first comparator generates a first output signal based on the input signal and the first built-in hysteresis;
    a second comparator configured to have a second built-in hysteresis and to receive the input signal, wherein the second comparator generates a second output signal based on the input signal and the second built-in hysteresis, wherein the first built-in hysteresis and the second built-in hysteresis are equal, and the rising edge threshold of the second comparator ($V_{thr,H}$) is higher (greater) than that of the first comparator ($V_{thr,L}$); and
    a selection circuit configured to receive the first output signal and the second output signal and generate an output signal of the slicer.

11. The slicer of claim 10, wherein the selection circuit is configured such that it selects the second output signal as the output signal of the slicer if the input signal goes above $V_{thr,H}$ and the first output signal as the output signal of the slicer if the input signal goes below $V_{thf,L}$.

12. A slicer for a data receiver with improved noise immunity and tolerance to signal level shift of an input signal to the data receiver, comprising:

a first circuit configured to receive the input signal and a first reference signal and generate a first output signal according to the first pair of threshold values, wherein the first pair of threshold values comprises a rising edge threshold $V_{thr1}$ and a falling edge threshold $V_{thf1}$, and $V_{thr1}$ is higher than $V_{thf1}$;

a second circuit configured to receive the input signal and a second reference signal and generate a second output signal according to the second pair of threshold values, wherein the second pair of threshold values comprises a rising edge threshold $V_{thr2}$ and a falling edge threshold $V_{thf2}$, and $V_{thr2}$ is higher than $V_{thf2}$;

a selection circuit configured to receive the first output signal and the second output signal and generate an output signal of the slicer.

13. The slicer of claim 12, wherein the second set of threshold values comprises a rising edge threshold $V_{thr2}$ and a falling edge threshold $V_{thf2}$, and $V_{thr1}$ is lower than $V_{thr2}$.

14. The slicer of claim 13, wherein the selection circuit is configured to perform one of the following:

output the result from the second comparator upon detecting that the input signal rises above $V_{thr2}$ and thereafter until the input signal falls below $V_{thf1}$; and output the result from the first comparator upon detecting that the input signal falls below $V_{thf1}$ and thereafter until the input signal rises above $V_{thr2}$.

15. A method for improving noise immunity and tolerance to input signal level shift of a data receiver, comprising:

receiving, at each of a plurality (N) of comparators, the input signal ($V_{in}$), wherein each comparator k is configured to have a built-in hysteresis with a rising-edge threshold equal to $V_{thr,k}$ and a falling-edge threshold equal to $V_{thf,k}$ respectively;

generating, at each comparator k an output signal $D_k$ corresponding to the input signal $V_{in}$;

maintaining a pointer P, at a selection circuit, wherein the pointer P is used to select one of the plurality of comparators; and generating the slicer output $D_{out}$, wherein $D_{out}$ equals to the output signal of a comparator identified by the pointer P.

16. The method of claim 15, wherein the plurality of comparators are configured such that $V_{thr,0} < V_{thr,1} < \ldots < V_{thr,k} < \ldots < V_{thr,N-1}$ and $V_{thf,0} < V_{thf,1} < \ldots < V_{thf,k} < \ldots < V_{thf,N-1}$.

17. The method of claim 15, wherein $D_k=1$ if $V_{in} > V_{thr,k}$, $D_k=0$ if $V_{in} < V_{thf,k}$, and $D_k$ does not change its state if $V_{thf,k} < V_{in} < V_{thr,k}$.

18. The method of claim 16, wherein the pointer P points to the next comparator up in the plurality of comparators if the input signal level rises above the rising edge threshold of the next comparator with a higher rising edge threshold, and the next comparator down the plurality of comparators if the input level drops below the falling edge threshold of the next comparator with a lower falling edge threshold.

* * * * *